(12) United States Patent
Cobb et al.

(10) Patent No.: US 12,199,026 B2
(45) Date of Patent: Jan. 14, 2025

(54) FLEXIBLE INTERPOSER

(71) Applicant: PRAGMATIC SEMICONDUCTOR LIMITED, Cambridge (GB)

(72) Inventors: Brian Cobb, Sedgefield (GB); Scott White, Sedgefield (GB); Ken Williamson, Sedgefield (GB); Anthony Sou, Sedgefield (GB); Catherine Ramsdale, Sedgefield (GB); Rob Mann, Sedgefield (GB); Neil Davies, Sedgefield (GB); Joao de Oliveira, Sedgefield (GB); Gillian Ewers, Sedgefield (GB); Pascaline Boulanger, Sedgefield (GB); Richard Price, Sedgefield (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 0 days.

(21) Appl. No.: 17/427,805

(22) PCT Filed: Jan. 31, 2020

(86) PCT No.: PCT/EP2020/052511
§ 371 (c)(1),
(2) Date: Aug. 2, 2021

(87) PCT Pub. No.: WO2020/161027
PCT Pub. Date: Aug. 13, 2020

(65) Prior Publication Data
US 2022/0130738 A1    Apr. 28, 2022

(30) Foreign Application Priority Data
Feb. 5, 2019 (GB) .................................. 1901556

(51) Int. Cl.
*H01L 23/498* (2006.01)
*H01L 23/00* (2006.01)
(Continued)

(52) U.S. Cl.
CPC ........ *H01L 23/4985* (2013.01); *H01L 23/367* (2013.01); *H01L 23/5387* (2013.01);
(Continued)

(58) Field of Classification Search
CPC ..... H01L 25/065; H01L 23/00; H01L 23/538; H01L 23/367; H01L 23/498;
(Continued)

(56) References Cited

U.S. PATENT DOCUMENTS 6,743,661 B1   6/2004  Drewery
7,667,310 B2 * 2/2010  Dozen .............. G06K 19/07749
                                                   257/678
(Continued)

FOREIGN PATENT DOCUMENTS

CN    17900706 A  *  6/2006  ......... H01L 25/0657
CN   102654713 A     9/2012
(Continued)

OTHER PUBLICATIONS

International Search Report for International Application No. PCT/EP2020/052511, mailed Mar. 31, 2020.
(Continued)

*Primary Examiner* — Herve-Louis Y Assouman
(74) *Attorney, Agent, or Firm* — Jason H. Vick; Womble Bond Dickinson (US) LLP

(57) ABSTRACT

An interposer subassembly that is suitable for an electronic system having at least one integrated circuit (IC) component. The interposer subassembly includes a flexible base layer, having a first surface and an opposing second surface, at least one active electronic circuit component, operatively (Continued)

integrated within the flexible base layer, and at least one first patterned contact layer, provided on any one of the first surface and the second surface of the flexible base layer and which is configured to operably interface with the at least one active electronic circuit component and the at least one 1C component.

22 Claims, 11 Drawing Sheets

(51) Int. Cl.
    *H01L 23/367* (2006.01)
    *H01L 23/538* (2006.01)
    *H01L 25/065* (2023.01)
(52) U.S. Cl.
    CPC .......... *H01L 24/48* (2013.01); *H01L 25/0655* (2013.01); *H01L 25/0657* (2013.01); *H01L 2224/48227* (2013.01); *H01L 2924/10253* (2013.01)
(58) Field of Classification Search
    CPC ....... H01L 2224/48227; H01L 25/0655; H01L 25/0657; H01L 2924/10253; H01L 24/48; H01L 23/5387; H01L 23/387; H01L 23/4985
    USPC .......................................... 257/678
    See application file for complete search history.

(56) References Cited

U.S. PATENT DOCUMENTS

| | | | |
|---|---|---|---|
| 8,913,402 B1 | 12/2014 | Berg et al. | |
| 9,646,917 B2* | 5/2017 | Katkar | H01L 23/481 |
| 9,972,579 B1* | 5/2018 | Kawabata | H01L 25/50 |
| 10,257,884 B2* | 4/2019 | Kuwabara | H05B 1/0233 |
| 10,278,289 B2* | 4/2019 | Yosui | H05K 1/18 |
| 10,468,578 B2* | 11/2019 | Elsherbini | H01L 23/49888 |
| 2002/0057610 A1* | 5/2002 | Baliga | H01L 24/40 |
| | | | 257/E21.418 |
| 2002/0076919 A1* | 6/2002 | Peters | H01L 23/552 |
| | | | 257/E23.079 |
| 2002/0185718 A1* | 12/2002 | Mikubo | H05K 1/0207 |
| | | | 257/E23.09 |
| 2009/0115050 A1* | 5/2009 | Kasuya | H01L 23/3677 |
| | | | 257/701 |
| 2009/0121346 A1 | 5/2009 | Wachtler | |
| 2009/0146315 A1 | 6/2009 | Shim et al. | |
| 2012/0224343 A1* | 9/2012 | Sato | G02F 1/1345 |
| | | | 361/760 |
| 2014/0299976 A1* | 10/2014 | Cho | H01L 24/85 |
| | | | 257/659 |
| 2017/0023748 A1 | 1/2017 | Lucero et al. | |
| 2017/0040306 A1* | 2/2017 | Kim | H05K 1/181 |
| 2017/0194263 A1 | 7/2017 | Kato | |
| 2017/0311448 A1* | 10/2017 | Kawabata | H01F 1/0306 |
| 2018/0033738 A1* | 2/2018 | Kawabata | H01L 23/49838 |
| 2018/0158782 A1* | 6/2018 | Kawabata | H01L 24/97 |
| 2018/0192520 A1* | 7/2018 | Choong | H01L 21/56 |
| 2019/0035744 A1* | 1/2019 | Kawabata | H01L 23/3114 |
| 2019/0057924 A1* | 2/2019 | Kim | H01L 23/5389 |
| 2020/0015357 A1* | 1/2020 | Kim | H01L 23/13 |
| 2020/0098692 A1* | 3/2020 | Liff | H01L 23/5386 |
| 2020/0328143 A1* | 10/2020 | Marinov | H05K 3/361 |
| 2021/0020602 A1* | 1/2021 | Chen | H01L 23/13 |
| 2022/0053633 A1* | 2/2022 | Schwarz | H05K 3/007 |

FOREIGN PATENT DOCUMENTS

| | | | | |
|---|---|---|---|---|
| CN | 203026507 U | * | 6/2013 | ............ H01L 27/32 |
| CN | 105552132 A | * | 5/2016 | ............ H01L 51/07 |
| DE | 102008022733 A1 | | 11/2009 | |
| JP | 2005045111 A | * | 2/2005 | ............... H05K 1/11 |
| WO | 2016048347 | * | 1/2016 | ............ H01L 24/18 |
| WO | WO 2019/116020 | | 6/2019 | |
| WO | WO 2020/161027 | | 8/2020 | |

OTHER PUBLICATIONS

Written Opinion for International Application No. PCT/EP2020/052511, mailed Mar. 31, 2020.
Combined Search and Examination Report Under Sections 17 and 18(3) for corresponding Great Britain Application No. 1901556.9, mailed Jul. 8, 2019.
Examination Report Under Section 18(3) for corresponding Great Britain Application No. 1901556.9, mailed Apr. 29, 2021.
International Preliminary Report on Patentability for International Application No. PCT/EP2020/052511, mailed Aug. 19, 2021.
Notification of Grant for corresponding Great Britain Application No. 1901556.9, mailed Oct. 12, 2021.

* cited by examiner

FLEXIBLE INTERPOSER

CROSS-REFERENCE TO RELATED APPLICATIONS

This application is a national stage application under 35 U.S.C. 371 of PCT Application No. PCT/EP2020/052511, having an international filing date of 31 Jan. 2020, which designated the United States, which PCT application claimed the benefit of Great Britain Application No. 1901556.9, filed 5 Feb. 2019, each of which are incorporated herein by reference in their entirety.

FIELD

The present invention relates generally to the field of electrical circuits and microchips and relates in particular to advanced flexible interposers and interconnects for Integrated Circuits (IC's).

INTRODUCTION

As modern electronic devices have become more complicated, it has also become more difficult to interconnect the various components. For example, the physical size of microprocessors, chips or integrated circuits (IC) continues to shrink, though the number of connection leads provided on such chips is increasing due to added functionalities. Interposers are used to connect a wide range of IC's (chips), such as memory chips and microprocessors, to various system components, such as, via a Printed Circuit Board (PCB), sensors, further IC's, discrete components such as antennas and capacitors, output components such as displays and loudspeakers, etc.

An interposer provides an electrical interface between one socket or connection to another, so as to, for example, spread a connection to a wider pitch, or to reroute a connection between a microchip (e.g. IC) and the system of which it is a part. FIG. 1 shows a typical example of a simple 'in-package' interposer 10, where bond wires 12 are used to connect the Pentium II CPU 14 to an array of solder ball contacts 16 to then interface with the rest of the PC's components via a PCB.

This type of interposer 10 is essentially a layer of finely patterned conductors that enable to 'fan-out' or redistribute from a dense array of IC contact pads (e.g. 'fine pitch') to a less dense array of contacts configured to interface with a 'wider pitch' system. Due to the high resolution required of this patterning (i.e. less than 10 µm), interposers have traditionally been manufactured in silicon (Si) using lithographic techniques. Also, it is often required that the interposer has contacts on both surfaces or faces (e.g. at the top and bottom faces) with conductors, such as 'through silicon vias' (TSV), routed between the top and bottom faces. So, a key benefit of using interposers is that the overall system size may be reduced by bringing the components together more closely.

When used in high performance systems, interposers may perform more complex roles, such as, for example, connecting multiple types of IC's and/or other components. FIG. 2 illustrates an example of '2.5D Integration', where an interposer 20 connects multiple IC's 22 to each other and to a package substrate 24, which interfaces with the wider system. These systems may be termed 'system in package (SiP)' and, as illustrated in FIG. 2, such interposers 20 can be very complex and their manufacture is expensive.

FIG. 3 illustrates another example of an interposer 30 including integrated passive devices 32, such as, for example, capacitors and inductors, the interposer 30 connecting multiple IC's 34. Interposer 30 may have a thickness in the region of 300 µm and two or more metal layers, offering low leakage current and allowing attachment by bumps 36, as well as, 'flip-chip' or 'die attach' and 'wire bond' 38 to PCBs, ceramic-, glass- and metal lead frame substrates.

Although silicon interposers dominate the market, some may be made from glass or from polymers (e.g. 'organic interposers'). FIG. 4 illustrates an example embodiment of an organic interposer structure 40 that may have multiple layers of conductors 42 and through-core vias (TCVs) (like larger flexible PCBs). Organic interposers may offer a saving of manufacturing costs over silicon interposers, as well as, a finer design rule than conventional PCB substrates, however, known organic interposers are configured to function as pure interconnects and are not adapted to integrate passive and/or active components.

It is an object of the present invention to provide an interposer with a thin and flexible form factor, improved functionality, as well as, reduced manufacturing costs.

SUMMARY

According to a first aspect of the present invention, there is provided an interposer subassembly for an electronic system having at least one integrated circuit (IC) component, comprising:
- a flexible base layer, having a first surface and an opposing second surface;
- at least one active electronic circuit component, operatively integrated within said flexible base layer;
- at least one first patterned contact layer, provided on any one of said first surface and said second surface of said flexible base layer, and configured to operably interface with said at least one active electronic circuit component and the at least one IC component.

This provides the advantage that the interposer can integrate active, as well as passive, components, whilst providing contact redistribution at a finer line pitch (i.e. in the order of 1 µm) than currently available organic interposers. Furthermore, the interposer of the present invention provides the advantage of further system volume and assembly costs reductions by replacing active and/or passive components with integrated equivalent components, and eliminates assembly steps, reduces the costs for materials, as well as, allowing optimal component positioning (e.g. immediately adjacent to an IC terminal). Also, some of the functions conventionally performed in silicon IC's (e.g. glue logic) are now performed by the interposer of the present invention allowing simplified and more compact silicon IC designs or even systems with fewer silicon IC's.

Advantageously, the interposer subassembly may further comprise at least one second patterned contact layer, provided on said flexible base layer at a surface opposite to said first patterned contact layer, and configured to operably connect to any one or any combination of said at least one active electronic circuit component, said first patterned contact layer, and the at least one IC. Additionally, said at least one first patterned contact layer may comprise a plurality of first contact elements having a first line pitch, and, said at least one second patterned contact layer may comprise a plurality of second contact elements having a second line pitch. Preferably, said first line pitch may be different to said second line pitch.

Advantageously, the interposer subassembly may further comprise at least one passive electronic circuit component, operatively integrated within said flexible base layer and operably connected to said at least one active electronic circuit component and/or said at least one first patterned contact layer and/or said at least one second patterned contact layer.

Advantageously, the interposer subassembly may further comprise at least one conductive via, extending through at least a portion of said flexible base layer between said first surface and said opposing second surface, configured to operably connect any one or any combination of said at least one active electronic circuit component, said at least one passive electronic circuit component, said at least one first patterned contact layer and said at least one second patterned contact layer.

Advantageously, said flexible base layer may comprise at least one dielectric layer material integrated within at least a portion of said flexible base layer and/or on at least a portion of said first surface of said flexible base layer and/or on at least a portion of said opposing second surface of said flexible base layer.

Advantageously, the interposer subassembly may further comprise at least one thermal management layer, operatively coupled to said flexible base layer, and configured to transfer heat energy away from any one or any combination of said at least one active electronic circuit component, said at least one first patterned contact layer, said at least one second patterned contact layer, said at least one passive electronic circuit component, and said at least one conductive via. Preferably, at least a portion of said at least one thermal management layer may be electrically insulating. Even more preferably, said at least one thermal management layer may have a predetermined coefficient of thermal expansion (CTE).

Advantageously, said at least one thermal management layer may be a heat sink and/or heat spreader embedded within said flexible base layer and thermally conductively coupleable to the at least one IC component.

The thermal management layer of the present invention provides the advantages of an improved heat management during operation of the embedded active and/or passive components, therefore, minimising potential damage cause by excessive heat retention within the system.

Advantageously, said at least one active electronic circuit component may be formed from any one of a semiconductor material and/or metal integrated into said flexible base layer. Preferably, said semiconductor material may have a predetermined dopant concentration. Additionally, said predetermined dopant concentration may be a predetermined concentration profile gradation of dopants.

Advantageously, said at least one active electronic circuit component may be a transistor.

Advantageously, said at least one passive electronic circuit component may comprise a metal integrated into said flexible base layer. Preferably, said at least one passive electronic circuit component may be any one of a resistor, capacitor, inductor and diode.

Advantageously, said at least one first patterned contact layer may be made of an electrically conductive material. Preferably, said electrically conductive material may comprise at least one metal.

Advantageously, said flexible base layer may be formed from any one or any combination of a substrate, glass, polymer, cellulose and metal.

Advantageously, the interposer subassembly may be configured so as to provide a predetermined gradation of the coefficient of thermal expansion (CTE).

According to a second aspect of the present invention, there is provided an electronic system comprising:
  interposer subassembly according to any one of the preceding claims;
  at least one first electronic component mounted to and electrically connected to said interposer subassembly.

Advantageously, said at least one first electronic component may be at least partially encased within an encapsulant material. Preferably, said encapsulant material may comprise a polymer.

Advantageously, said at least one first electronic component may be electrically connected to said interposer subassembly by at least one wire bond.

Alternatively, said at least one first electronic component may be electrically connected to said interposer subassembly in a flip-chip configuration.

BRIEF DESCRIPTION OF THE DRAWINGS

Example embodiments of the description will now be described, by way of example only, with reference to the accompanying drawings, in which.

DETAILED DESCRIPTION OF THE PREFERRED EMBODIMENT(S)

The described example embodiments relate to interposer technology. The interposer generally serves as an intermediate subassembly that can be positioned in between, and electrically interconnecting, one component or substrate and another component or substrate with the interposer positioned in between, as well as, interconnecting.

Throughout the specification, the term "connected" is understood to mean a direct connection such as electrical, mechanical or magnetic connection between the things that are connected. The term "coupled" is understood to mean a direct or indirect connection (i.e. through one or more passive or active intermediary devices). The term "scaling" may be understood to generally refer to converting one layout pitch to another layout pitch. Further, unless otherwise specified, the use of ordinal adjectives, such as, "first", "second", "third" etc. merely indicate that different instances of like objects are being referred to and are not intended to imply that the objects so described must be in a given sequence, either temporally, spatially, in ranking or in any other manner. Orientation terminology, such as, "horizontal" is understood with respect to a plane parallel to the conventional plane or surface of a wafer or substrate, regardless of the orientation of the wafer or substrate. The term "vertical" may refer to a direction perpendicular to the horizontal as defined previously. Prepositions, such as, "on", "side", "higher", "upper", "lower", "over", "bottom" and "under" may be understood with respect to the conventional plane or surface being on the top surface of the wafer or substrate, regardless of the orientation the electrical interconnects or the electronic package.

Figure 1:
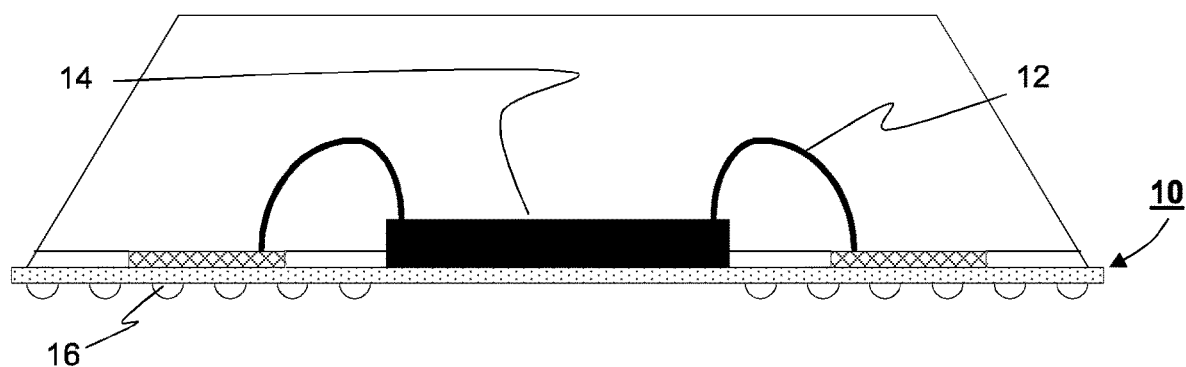
FIG. 1 (Prior Art) is a simplified schematic illustration of a ball-grid-array (BGA) with an interposer provided between the integrated circuit (IC) die and the BGA, for example, in the Pentium II CPU.
Figure 2:
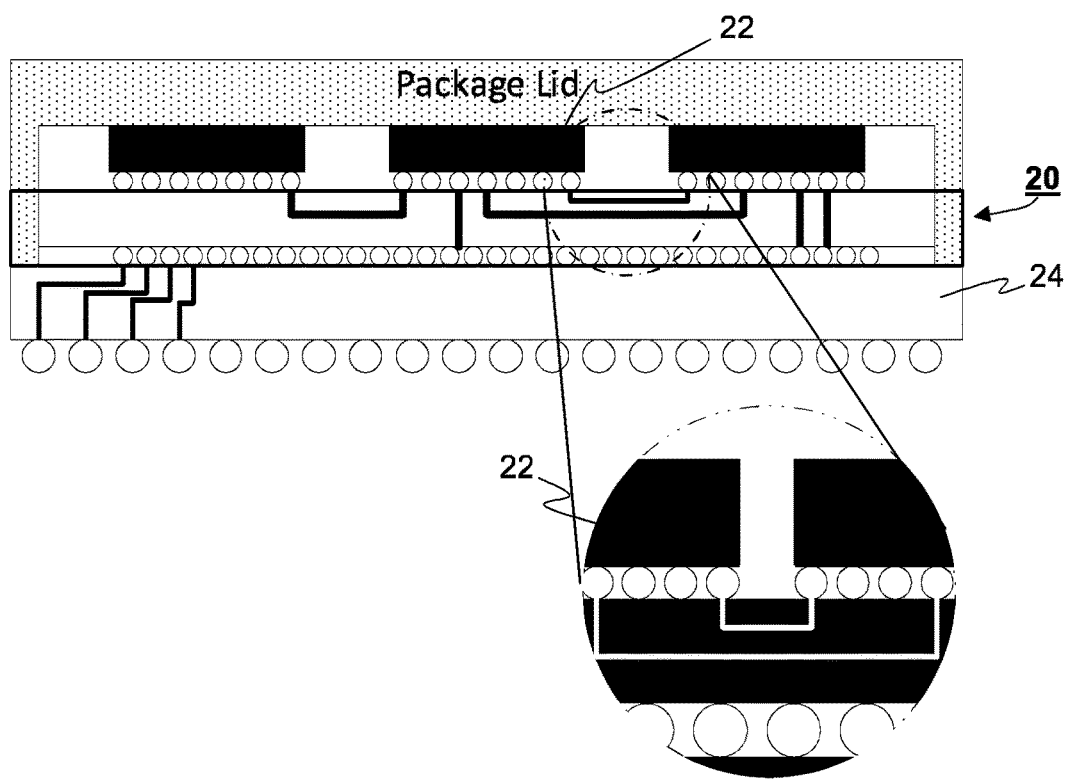
FIG. 2 (Prior Art) is a simplified schematic illustration of a high-performance system (2.5D integration), where an interposer connects multiple IC's to each other, as well as, to a package substrate.
Figure 3:
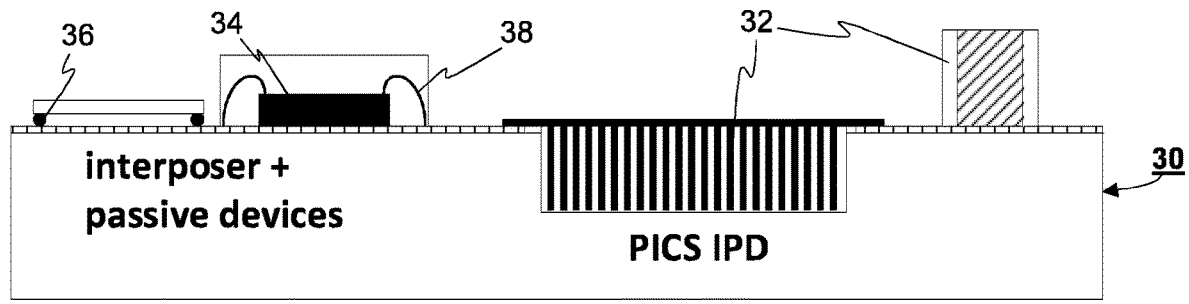
FIG. 3 (Prior Art) shows a schematic of a IPDiA (now Murata Integrated Passive Solutions) with PICS IPD (Passive Integrated Connective Substrate, Integrated Passive Devices) and external active dies in a flip-chip or chip-on-silicon technology.
Figure 4:
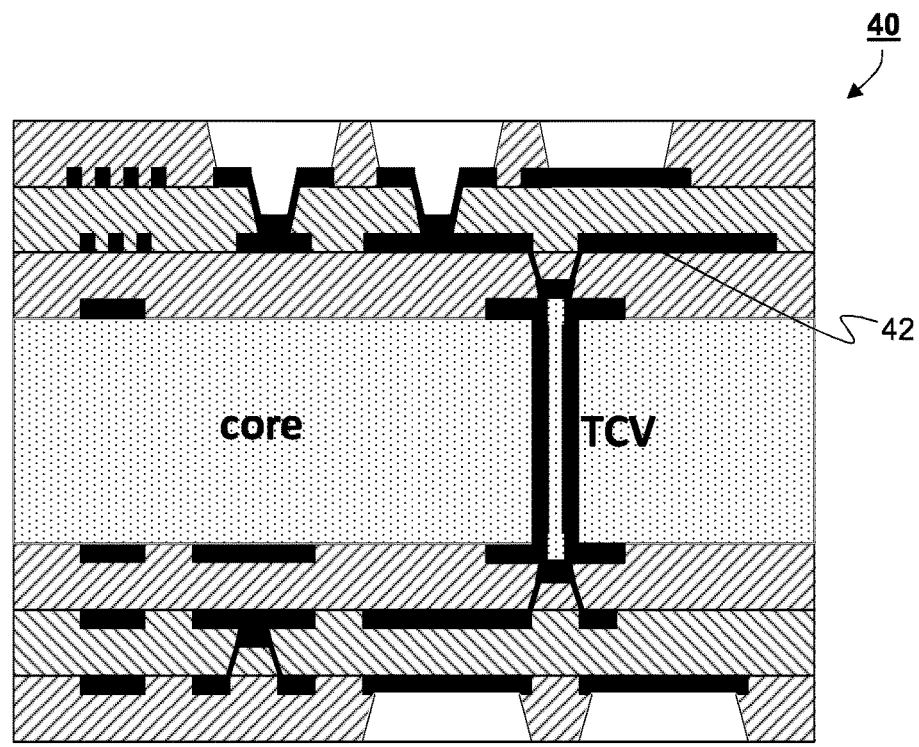
FIG. 4 (PriorArt) shows an illustration of a simplified cross-sectional schematic of an organic interposer structure, utilising high-modulus organic materials (e.g. polymers)
Figure 5:
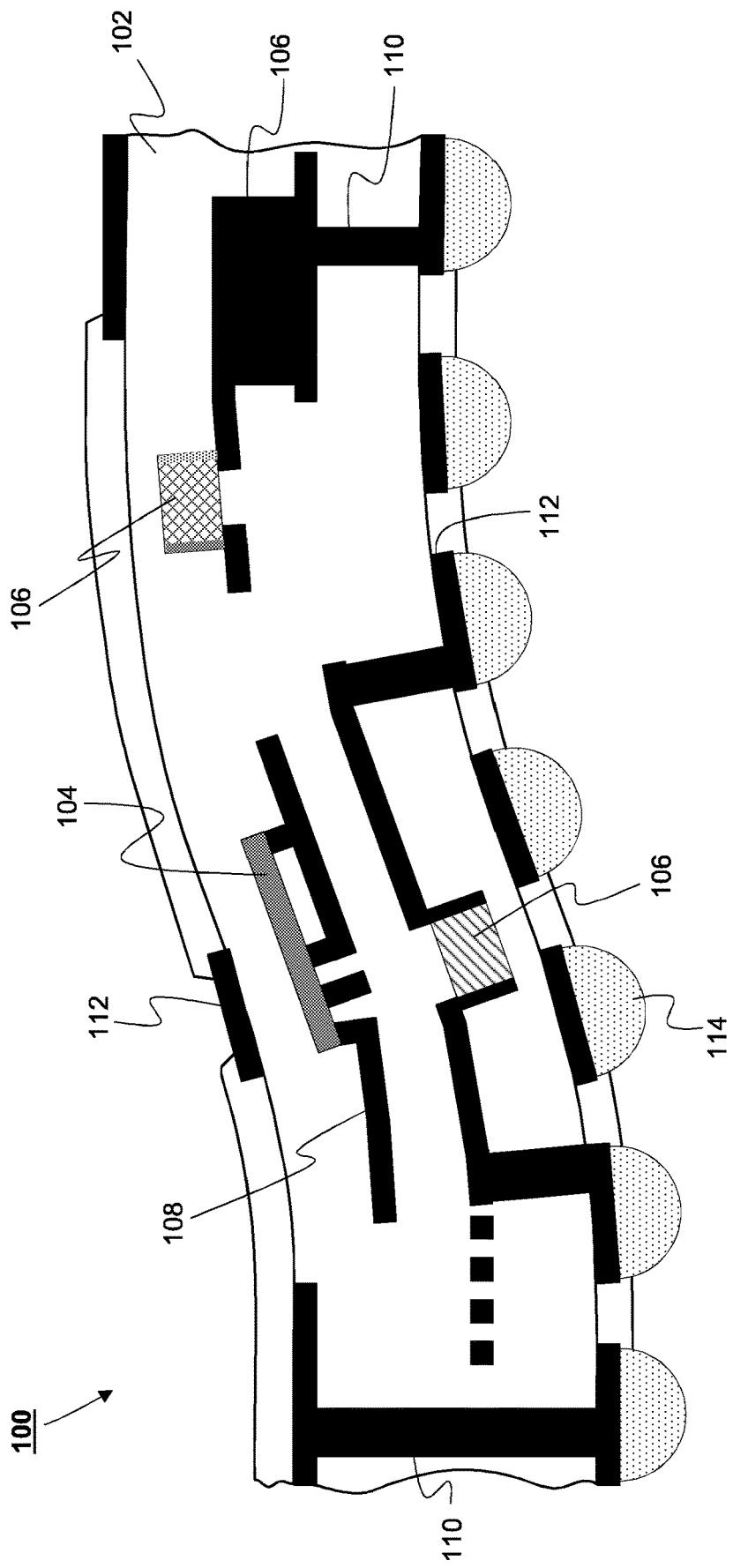
FIG. 5 shows a simplified cross-sectional illustration of an example embodiment of the present invention, including a flexible interposer comprising, inter alia, embedded passive and active electronic components.
Figure 18:
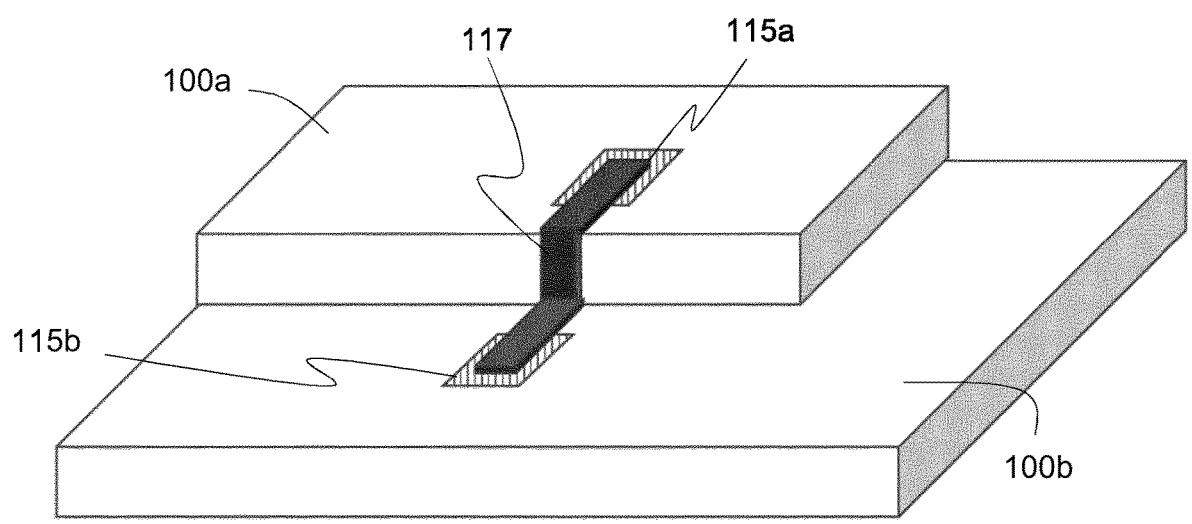
FIG. 18 is a simplified perspective illustration of a flexible interposer interfaced to a flexible IC, or to another flexible interposer.

Referring now to FIG. 5, a simplified cross-section schematic illustration of an example embodiment of the flexible interposer 100 of the present invention is shown. The flexible interposer 100 comprises, inter alia, a flexible substrate or member 102 having active electronic components 104, as well as, passive electronic components 106 incorporated therein. Electrically conducting interconnects, such as, for example, conductor layers or signal lines 108 and vias 110, are incorporated into and on the flexible substrate or member 102, so as to connect and/or couple contact(s) 112 provided on the top or bottom surface of the flexible substrate or member 102. Bumps or balls 114 or other joining means known in the art may then be used to provide an interface with an external component, such as, a Printed Circuit Board (PCB) or another microchip, die or Integrated Circuit (IC), but may also be used to interconnect stacked multiple interposers 100.

Where a flexible interposer 100 is interfaced to a flexible Integrated Circuit (IC), or to another flexible interposer 100, a variety of techniques may be used to attach them. 'Flip chip' type attachment using balls or bumps 114 may be used, as mentioned above, or conductive adhesives and/or non-conducting adhesives may be used, as is known in the art. Alternatively the flexible interposers 100 (or flexible interposer and flexible IC) may both be arranged with their electrical contacts facing in the same direction (as illustrated in FIG. 18). One or more electrical contacts 115a on a flexible interposer 100a may be electrically connected to one or more electrical contacts 115b on the attached interposer 100b or flexible IC using a printed wire bond 117, for example using conductive ink. These electrical connection(s) may be sufficient to secure the two flexible structures together or additional means may be required, for example using non-conductive adhesive between the two flexible structures 100a, b.

The active 104 and passive 106 electronic components embedded in the interposer(s) 100 may include transistors, capacitors, inductors and/or resistors, whilst the interconnects (conducting layers, vias) 108, 110 and contacts 112 are configured to provide contact redistribution. Advantageously, the interposer of the present invention is capable of providing redistribution at a finer line pitch (e.g. of the order of 1 µm) than currently known organic (i.e. flexible) interposers.

In addition to providing a thin, flexible form factor and a system volume reduction, the flexible interposer 100 of the present invention incorporates active 104 and passive 106 components into the fabric (i.e. the substrate or member 102) of the interposer 100 allowing for further system volume and assembly cost reductions. For example, discrete passive/active components may be replaced with integrated equivalents, therefore, eliminating one or more assembly steps, as well as, reducing the cost of materials and allowing for optimal component positioning (e.g. immediately adjacent to an IC terminal). Further, by performing some of the functions that are conventionally performed in Si (silicon) IC's, the interposer 100 allows for a simplified and more compact Si IC design. Even more, an entire Si IC may be removed from the system by performing its function(s) in the interposer 100.

(i) Thermal Management Feature(s)

Figure 6:
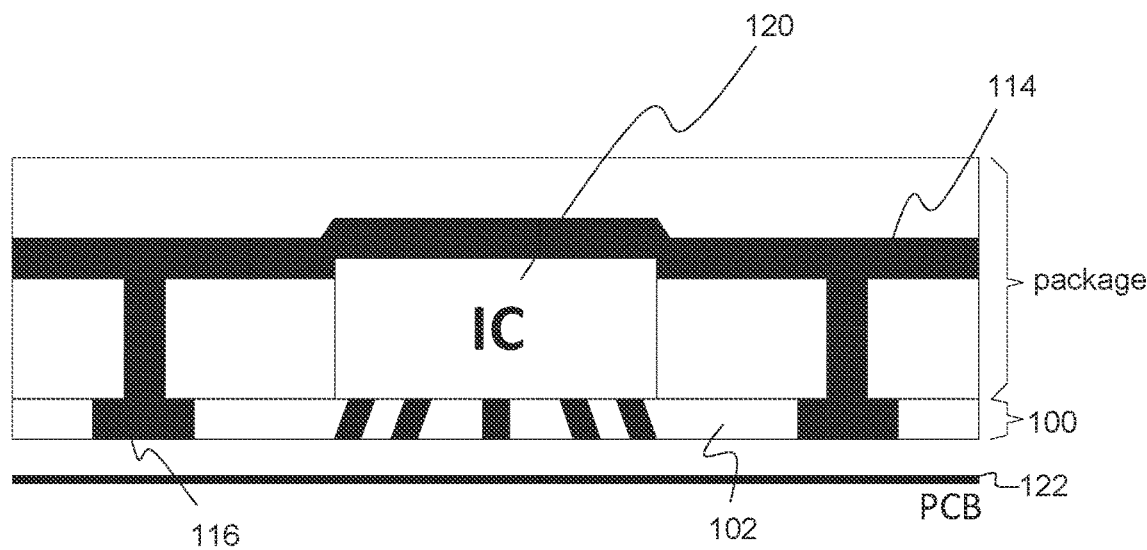
FIG. 6 (a) shows a simplified cross-sectional illustration of another example embodiment of the present invention, where a flexible interposer stack further comprises thermal management features, and FIG. 6 (b) shows a simplified cross-sectional illustration of another example embodiment of the present invention, where the heat sink connection is made through the interposer substrate directly to the PCB (Printed Circuit Board)
Figure 6:
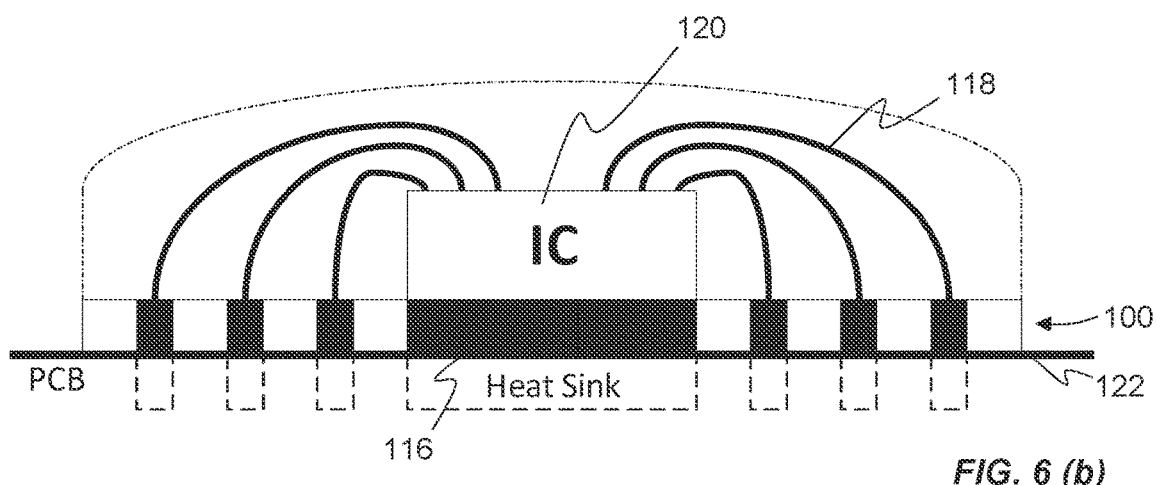

Referring now to FIGS. 6 (a) and (b), the interposer assembly of the present invention may comprise thermal management features, such as, for example, thermally conducting/dissipation layer(s) or inclusions 116 that may be embedded in the flexible interposer stack. Such features may supplement or replace thermal management features in the adjoining components, e.g. in a chip package if present (e.g. heat spreader 114) or in a PCB (e.g. heat sink). In case the thermal management feature(s) are also electrically insulating (e.g. using carbon black or alumina, i.e. $Al_2O_3$), such feature(s) may also replace an inter-metal dielectric or passivation layer of the interposer. Such layers, whether electrically insulating or otherwise, may then connect to "islands" or heat sink features in a PCB (122) or package and provide a thermal contact with any embedded Si IC.

The flexible interposer 100 integrity may also be optimised by incorporating coefficient of thermal expansion (CTE) gradations through the layers of the interposer assembly stack. For example, a layer adjacent to the Si IC may be formed from a material having a CTE that is similar to that of Si, whilst a layer adjacent to the PCB or package may be formed from a material that has a similar CTE to that of the PCB or package compound.

As shown in FIG. 6(b), an embedded ground plane may be utilised as a heat dissipation layer or heat sink 116. Heat sink connections may be made for an attached Si IC 120 through the interposer substrate 102 directly to the PCB 122. Wire bonds 118 or other signal connections may be made from the Si IC 120 to the PCB 122 through the interposer 100. Further, a predetermined interposer architecture may assist heat dissipation vertically or separate out components laterally.

(ii) Manufacture

In general, embodiments of the interposer 100 of the present invention may be manufactured by using known thin-film and lithographic techniques. For example, materials may be deposited in layers by a technique, such as vapour deposition (physical, e.g. sputter or chemical, e.g. PECVD), vacuum deposition (e.g. thermal or e-beam evaporation); coating (spin, dip, blade, bar, spray, slot-die), printing (jet, gravure, offset, screen, flexo), pulsed-laser deposition (PLD), atomic layer deposition (ALD) and/or other currently known techniques. Patterning of deposited materials may be performed by CBD (coat, bake, develop) and photo-lithography (i.e. exposure), electron beam lithography, x-ray lithography, ion-beam lithography, printing and/or other currently known techniques. The patterning may be combined, where applicable, with wet and/or dry (plasma) etching, ablation, milling, and/or lift-off patterning.

Different layer types of the interposer assembly may be as follows:

Interposer Substrates

Any suitable materials may be used as a substrate 102, which may be composed from one or more layers of such materials. The substrate 102 may be flexible, comprising any one or more materials from the following list:

glass (rigid or flexible); polymer (e.g. polyethylene naphthalate, polyethylene terephthalate; polymethyl methacrylate; polycarbonate, polyvinylalcohol; polyvinyl acetate; polyvinyl pyrrolidone; polyvinylphenol; polyvinyl chloride; polystyrene; polyethylene naphthalate; polyethylene terephthalate; polyimide, polyamide (e.g. Nylon); poly(hydroxyether); polyurethane; polycarbonate; polysulfone; parylene; polyarylate; polyether ether ketone (PEEK); acrylonitrile butadiene styrene; 1-Methoxy-2-propyl acetate (SU-8); polyhydroxybenzyl silsesquioxane (HSQ); Benzocyclobutene (BCB)); Al2O3, SiOxNy; SiO2; Si3N4; UV-curable resin; Nanoimprint resist; photoresist; polymeric foil; paper; insulator-coated metal (e.g. coated stainless-steel); cellulose.

Relatively thick substrate layers may be used for embedding IC's 120 and/or electronic components 104, 106, as well as, for decoupling the interposer's metal layers. This might necessitate filling any vias 110 by plating and defining the patterns by photo-patterning.

Some embodiments of the interposer 100 may not comprise a substrate 102, as such. The conductors 108, 110 and active 104 and passive 106 components may be separated by one or more dielectric materials (e.g. as listed under "Dielectrics") and there may be no further structural materials in such examples. In other embodiments both substrate and dielectric materials may be present in the substrate 102.

Dielectrics

Elements of the interposer 100, and of the active 104 and/or passive 106 components integrated within the interposer 100, may comprise a dielectric material. Examples of suitable materials include:

metal oxides such as Al2O3, ZrO2, HfO2, Y2O3, Si3N5, TiO2, Ta2O5; metal phosphates such as Al2POx; metal sulphates/sulphites such as HfSOx; metal nitrides such as AlN; metal oxynitride such as AlOxNy; inorganic insulators such as SiO2, Si3N4, SiNx; spin on glass (such as polyhydroxybenzyl silsesquioxane, HSQ), polymeric dielectric materials (such as Cytop, a commercially available amorphous fluoropolymer), 1-Methoxy-2-propyl acetate (SU-8), benzocyclobutene (BCB), polyimide, polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate, parylene, silicone; UV-curable resins; Nanoimprint resists; or photoresists. The dielectric material may have a relatively low dielectric constant (low-K, e.g. Cytop, HSQ, parylene) or a relatively high dielectric constant (high-K, e.g. Ta2O5, HfO2).

Metal Layers

Metals may be used for the interposer conductors (i.e. interconnects 108, vias 110, contacts 112) and/or for the conductive elements of integrated active 104 or passive 106 components. The conductive elements may include, for example, capacitor plates, inductor windings or transistor electrodes. There are numerous suitable materials, including:

metals, such as, Au, Ti, Al, Mo, Pt, Pd, Ag, Cu, Ni, Cr, Ta, W; metal alloys, such as, MoNi, Mo Cr, AlSi; transparent conductive oxides, such as, ITO, IZO, AZO; metal nitrides, such as, TiN; carbon materials, such as, carbon black, carbon nanotubes, graphene; conducting polymers, such as, polyaniline, PEDOT:PSS; or semiconductor material.

Metal features may comprise one or more layers of the same or different metals, as is well known in the art. Thicker metal layers may be formed to minimise electrical resistance, using a high aspect ratio (i.e. layer thickness/layer width) in order to retain high line density (ca. 1 µm track plus the gap pitch). For example, some Si IC's may draw ca. 2A (Ampere) current at 1.3V (Volt), so, the metal tracks in the interposer 100 may be of the order about 2 µm thick. Options to fulfil these requirements include (i) dry etching, to preserve definition at thickness, (ii) plating, (iii) the use of low resistance metals, such as gold, silver, copper and/or aluminium, or (iv) planarisation techniques.

Shielding metal layers may be built into the flexible interposer 100, e.g. to reduce any unwanted coupling between any components. Additionally or alternatively, shielding may protect ICs against external phenomena such as X-rays or other electromagnetic or particle radiation (e.g. beta-particles, gamma-rays), or may incorporate magnetic shielding properties. Such functionalities provide the flexible interposer 100 with packaging capabilities.

In some embodiments, through-film vias 110 and contacts 112 at both surfaces of the interposer 100 are necessary. Examples for producing such vias and contacts are as follows:

Metal pad areas may be patterned directly on the (e.g. glass) carrier, or on an intervening release layer, before spin-coating a polymer film. Vias 110 may then be etched through the film (e.g. with an oxygen plasma dry etch, after photo-resist patterning), and connections may be made to the upper layers. The connections may be made with an upper metal layer that routes over positively sloped sidewalls around the etched vias to form connections, or by other methods suitable to fill the vias 110, such as, electro/electro-less plating techniques. In this method, the vias in the substrate 102 connecting to the bottom pad may consist of a limited area, with the pad extending beyond them.

A polymer film is deposited on a (e.g. glass) carrier, then, vias are etched, in this particular case, with positive sidewalls. A metal is then deposited, allowing for no breakages at the via edges, thus, routing the metal both down, to contact the glass, and up, to the top of the polymer film (forming substrate 102). In this method, the bottom pad area is defined by the size of the via, leading to large etched regions of the polymer film.

Alternatively, through-film vias may be produced mechanically instead of using deposition processes.

Figure 7:
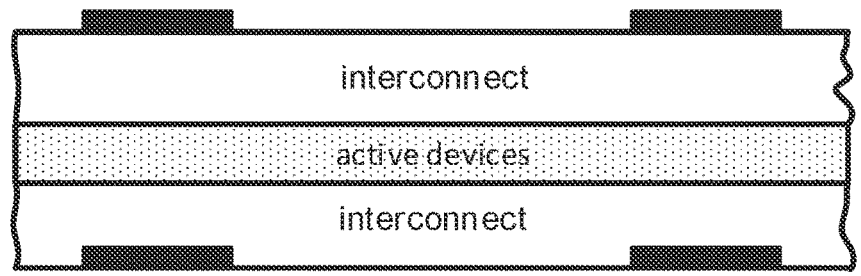
FIG. 7 shows a simplified cross-sectional schematic illustration of a double-sided interposer structure "sandwiching" a layer of active devices between two interconnect layers.

FIG. 7 shows an illustration of a double-sided interposer structure that may be adopted in order to provide a high routing density and allow access to contacts on both surfaces of the interposer by, for example, sandwiching a layer of active devices between two interconnect layers.

Semiconductors

Any known thin film semiconductor material may be used in the active devices 104 integrated into the interposer 100. Such materials may include:

compound semiconductors, such as GaAs, GaN, InP, CdSe, InGaAs, InGaAsSb; Metal oxides, their alloys and doped variants, such as ZnO, ZnSnO, NiO, NiSnO, SnO, SnO2, Sn(y)O, SnLiO, SnAlOx, Cu2O, CuZnO, CuLiO, CuAlO2, In2O3, LiZnO, InSnO (ITO), InZnO (IZO), HfInZnO (HIZO), InGaZnO (IGZO), La2O2Te, spinel oxides; Metal oxynitrides, e.g. ZnxOyNz; Metal halides, such as CuI, CuSnI; Inorganic semiconductors, such as amorphous, microcrystalline or nanocrystalline Si; Organic semiconductors, such as CuPc, pentacene, PTCDA, methylene blue, Orange G, rubrene; polymer semiconductors, such as PEDOT:PSS, POT, P3OT, P3HT, polyaniline, polycarbazole; 2D materials, such as graphene; Chalcogenides, such as, MoS2, GeSbTe; and perovskites, such as, SrTiO3, CH3NH3PbCl3, H2NCHNH2PbCl3, CsSnI3. These semiconductor materials may also be doped or contain a doping gradient and may be n-type or p-type.

When manufacturing interposer 100, in order to remove any maximum interposer size limitations set by the field of view of the lithography equipment, features in adjacent exposures may be connected in different layers, or by using known techniques such as reticle stitching. Also, Si IC's 120 and other components may be assembled by 'pick and place' (or similar processes) onto the flexible interposer 100 partway through the interposer manufacturing process flow.

Figure 19:
FIGS. 19(a)-(j) are illustrations of manufacturing steps (a) to (j) for a 'mount silicon first' approach.
Figure 19:
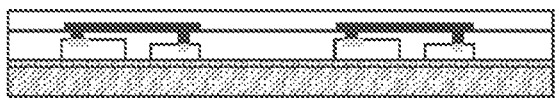
Figure 19:
Figure 19:
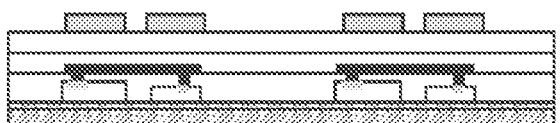
Figure 19:
Figure 19:
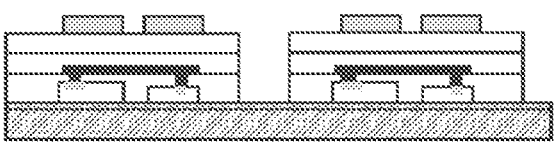
Figure 19:
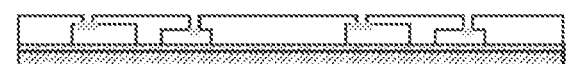
Figure 19:
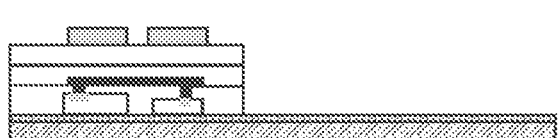
Figure 19:
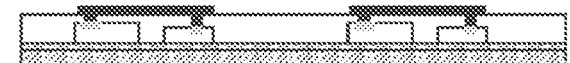
Figure 19:
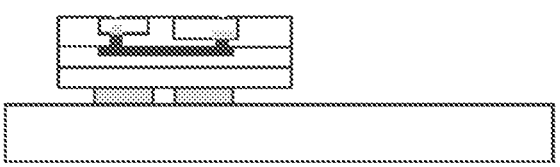

The manufacturing process may use the "Mount silicon first" approach, where system components (IC's, discrete components) are temporarily adhered to a carrier, before the components are coated and patterned with dielectric. A metal layer connects the components into a subsequent active/passive flexible interposer layer. After that, a redistribution layer (RDL) is provided, the systems are diced, detached from the carrier and attached to a PCB or other destination. FIGS. 19 (*a*) to (*j*) illustrate the process including the steps (a) glass (or SI) carrier, (b) adhesive coating, (c) place SI IC's and any components, contacts-side upwards, (d) coat, pattern (windows), cure thick PI (or other organic dielectric), (e) metal deposition and patterning, (f) TFT stack processing (semiconductors, dielectric, metal lines, etc. forming active and passive components and tracking), (g) final passivation and RDL (metal contacts and vias) layers, (h) dice, (i) pick/place, (j) attach (solder/ACP/etc.) to system level PCB, where the interposer comprising layers from step (e) (i.e. 'metal deposition and patterning' to step (g) (i.e. final passivation and RDL') inclusive, i.e. the interposer is in effect being manufactured on top of the silicon IC's (SI IC's).

The electronic connections between the interposer and Si IC's 120 (and other system components) may be made using any appropriate conventional techniques, for example (i) thermosonic/ultrasonic bonding or soldering to connect a Si IC 120 to the flexible interposer 100 without any anisotropic conductive paste (ACP) or bumps, (ii) an adhesive layer, e.g. ACP, or (iii) "Printed wire bond", so as to connect Si IC's 120 that are embedded, contact side upwards, in the flexible interposer 100, as illustrated in FIG. 18 for connecting flexible interposers 100*a*, 100*b*, to each other or to respective flexible IC's.

The manufacturing process may include testing, such as, an in-line flexible interposer 100 functional test that is performed prior to completion of the flexible interposer stack, ensuring that Si IC's 120 are only attached to "working" interposers 100. Further, in-line measurement and trimming of passive components may be performed, e.g. by laser, to ensure accurate values.

Yield optimisation and/or trimming may be provided, e.g. via a laser PROM (programmable read-only memory).

(iii) Geometric Arrangement Examples

Examples of various geometric arrangements are now described with reference to FIGS. 8 to 17. However, it is understood by the person skilled in the art that the present invention is not limited to those specific examples and any other suitable arrangement may be used when incorporating the flexible interposer 100 of the present invention.

Figure 8:
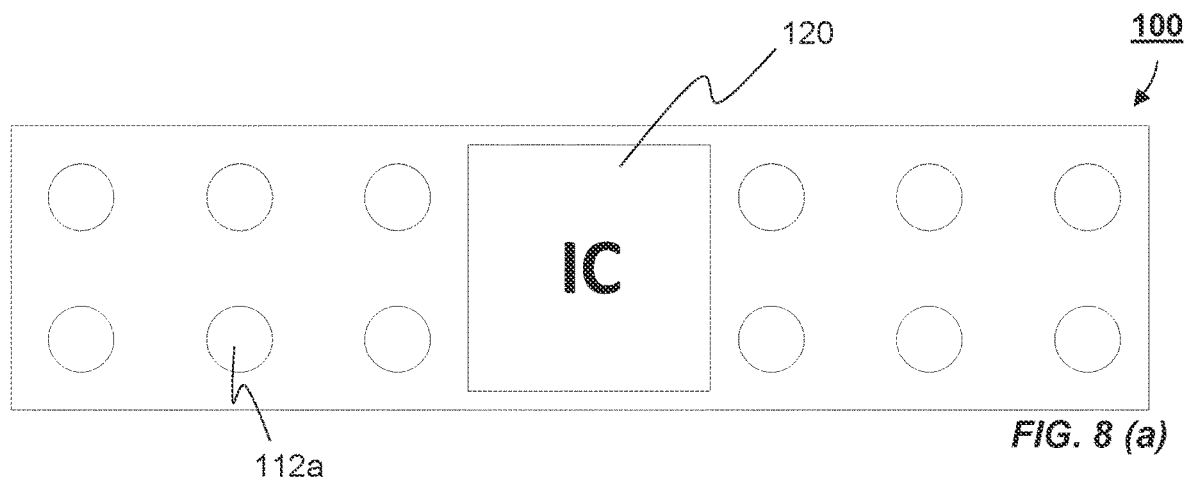
FIGS. 8(a)-(c) are simplified illustrations of another example embodiment of the present invention, in form of a "strap-attach" fan-out flexible interposer, (a) top-view, (b) side-view of two-sided flip-chip Si IC and (c) one-sided flip-chip Si IC.
Figure 8:
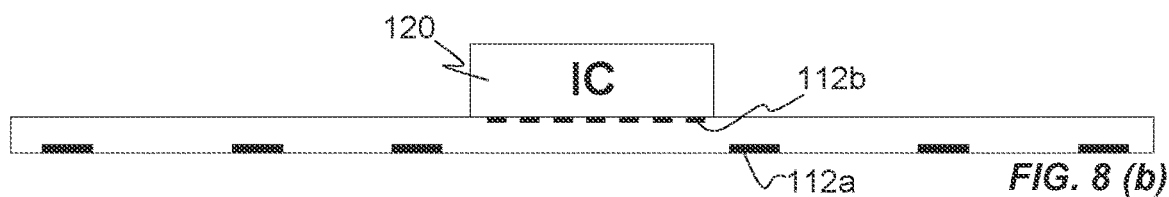
Figure 8:
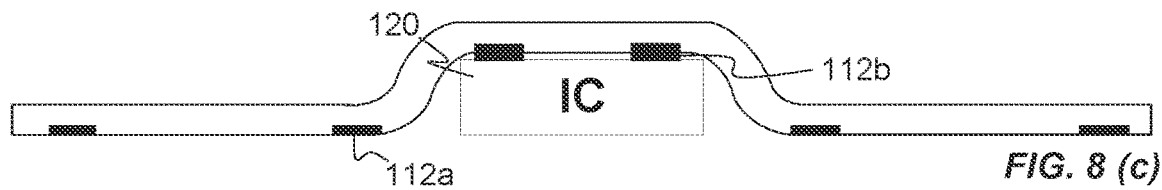

FIG. 8 (a) illustrates a top-view of a "strap attach" fan-out flexible interposer 100, incorporating PCB contacts 112a on the underside of the interposer 100, where interposer 100 connections may be either (b) two-sided (e.g. IC contacts 112b on the upper side for a flip-chip silicon IC 120, and PCB contacts 112a on the lower side) or (c) one-sided (e.g. on the lower side both for PCB contacts 112a and for IC contacts 112b, for a Si IC 120 mounted with its pads facing upwards on a PCB (not shown).

Figure 9:
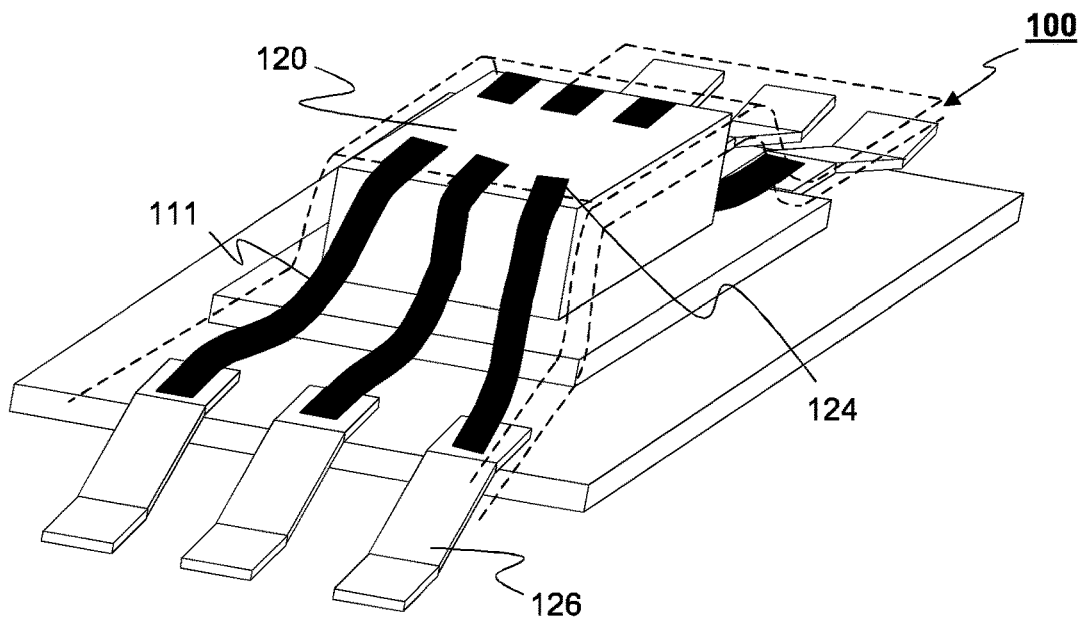
FIG. 9 is a simplified perspective illustration (flexible base layer shown as dotted line) of another example embodiment of the present invention in form of a "skirt" interposer suitable to replace wire bonding.

FIG. 9 illustrates an example of a "skirt" interposer 100 that may be used to replace wire bonding, such as that used inside conventional Si IC packages, i.e. connecting the IC pads 124 to a lead frame. After the Si IC 120 has been attached to the package chassis or other support structure, interposer 100 is placed onto the top side of Si IC 120. The interposer tracks 111 are then bonded, e.g. ultrasonically bonded, to the IC pads 124 at one end, and to the lead-frame 'leg' pads 126 at the other. In some manufacturing processes, all IC pad-to-interposer connections are made substantially simultaneously, then all lead-frame leg pad-to-interposer connections are made substantially simultaneously in a subsequent step.

Figure 10:
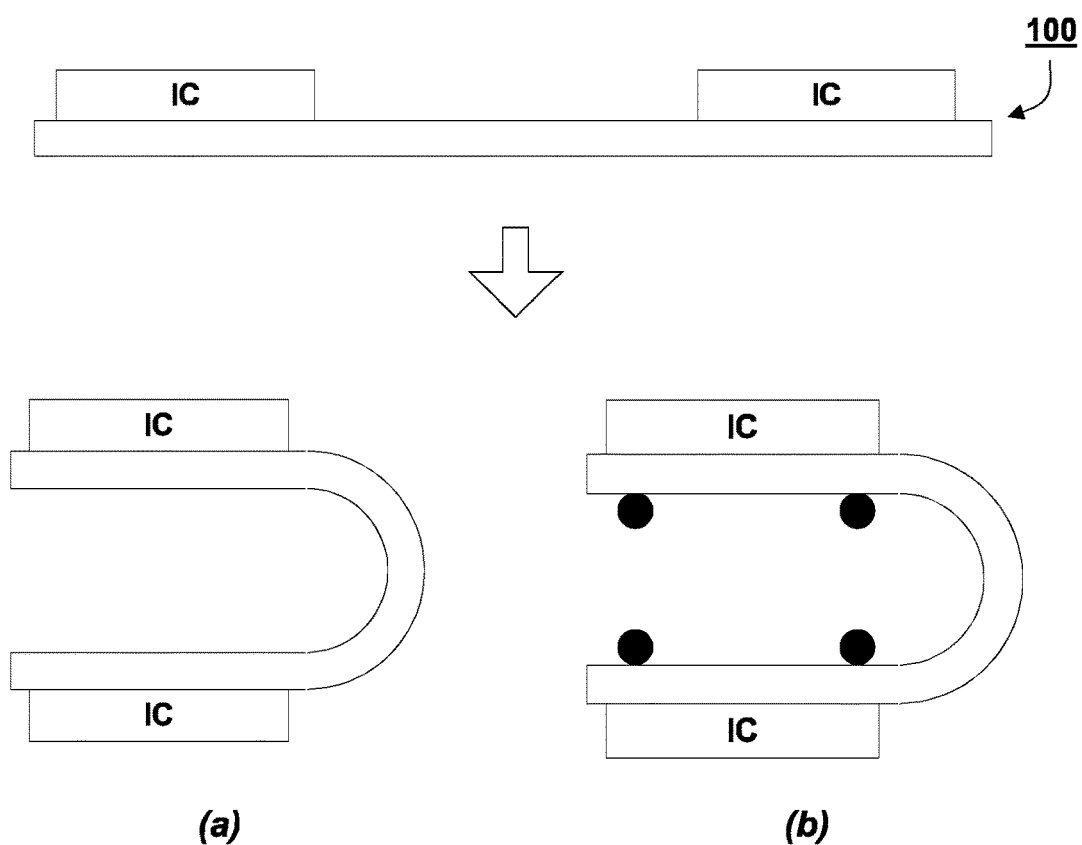
FIG. 10 is a simplified illustration of another example embodiment of the present invention, (a) in form of a folded, single-sided flexible interposer, and (b) in form of a double-sided flexible interposer, i.e. with through-substrate vias to shorten the routing path between two or more IC's.

FIG. 10 (a) illustrates an example of a folded, single-sided flexible interposer 100, providing a smaller footprint stacked system and (b) a folded, double-sided flexible interposer 100, i.e. with through-substrate vias, to shorten the routing path between two or more IC's 120. Both examples provide a potentially simpler assembly process than placing components/IC's on opposing sides of the interposer 100, and both could, for example, connect IC's and other components in a 2.5D SiP.

Figure 11:
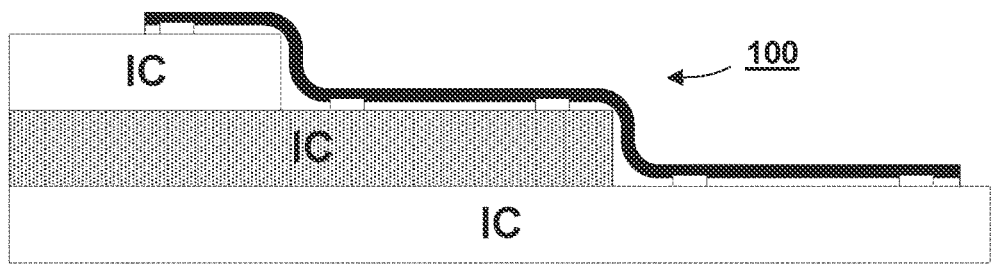
FIG. 11 is a simplified illustration of another example embodiment of the present invention, in form of a flexible interconnect for 3D stacked IC's, so as to provide a replacement for through-silicon vias (TSV)

FIG. 11 illustrates an example of a flexible interposer 100 interconnecting 3D stacked IC's, so as to provide a lower cost alternative to through-silicon vias (TSV).

Figure 12:
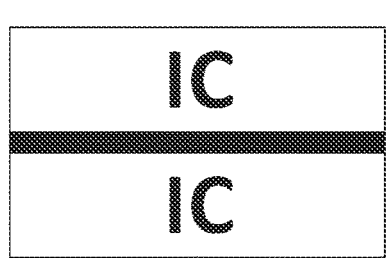
FIG. 12 is a simplified illustration of another example embodiment of the present invention, in form of an interposer including glue logic/interface matching for 3D vertically stacked Si IC's.

FIG. 12 illustrates an example of a flexible interposer 100 for 3D vertically stacked silicon IC's, e.g. including glue logic/interface matching. Glue logic may be incorporated into an interposer when connecting off-the-shelf ICs with different I/O protocols or characteristics.

Figure 13:
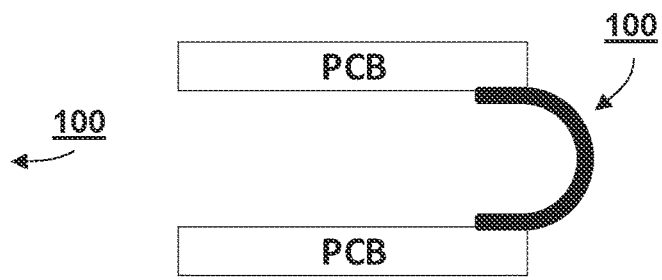
FIG. 13 is a simplified illustration of another example embodiment of the present invention, where the flexible interposer is in form of a ribbon cable with integrated active and passive electronic components.

FIG. 13 illustrates an example of a flexible interposer assembly 100 (i.e. flexible IC) as a PCB-to-PCB ribbon cable with integrated active components and/or passive components.

Figure 14:
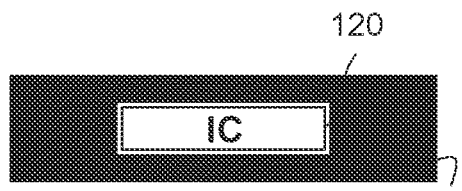
FIGS. 14(a)-(c) are simplified illustrations of another example embodiment of the present invention where the Si IC is embedded in the flexible interposer (e.g. polymer), in, in particular, (a) a thinned Si IC (e.g. 2 μm) is embedded in the flexible interposer (ca. 10 μm to 20 μm), (b) the Si IC is recessed or embedded in the flexible interposer substrate and (c) shows a double-sided flexible interposer with Si IC on the upper side embedded in rigid or flexible encapsulation or board/package.
Figure 14:
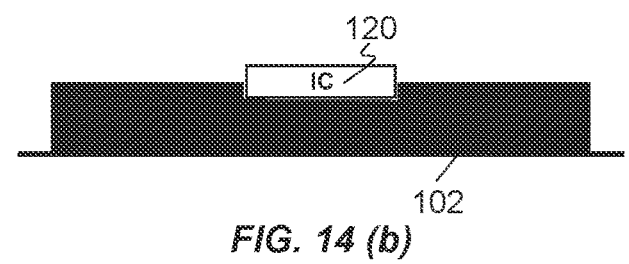
Figure 14:
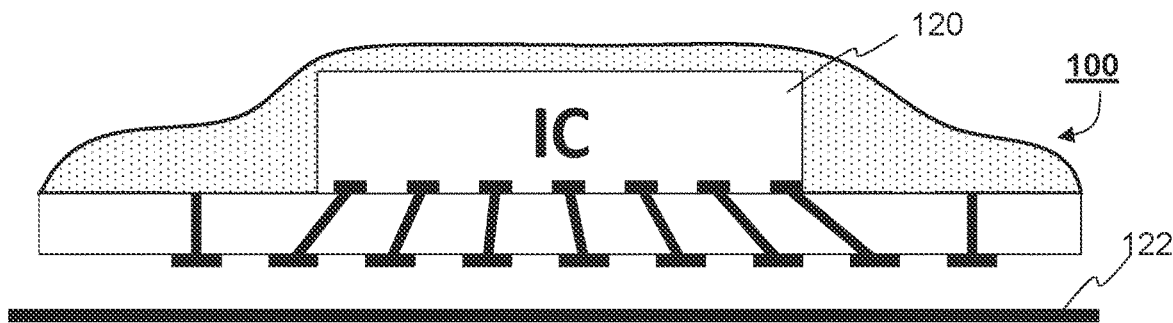

FIG. 14 (a) illustrates an example for connecting a thinned Si IC 120 on a flexible interposer, e.g. a 2 µm thick Si IC on a 10 µm thick flexible interposer assembly (i.e. flexible IC), providing a fully flexible "large area" IC, where the Si IC 120 may be embedded in the flexible interposer assembly (i.e. flexible IC, e.g. 10 µm-20 µm). FIG. 14(b) illustrates an example for a recessed or embedded Si IC 120 in the flexible interposer substrate 102. This arrangement provides improved mechanical performance, and advantages over known approaches. FIG. 14 (c) shows a more detailed illustration of the example for a double-sided flexible interposer with Si IC on both sides, embedded in rigid or flexible passivation, encapsulation or board/package.

Figure 15:
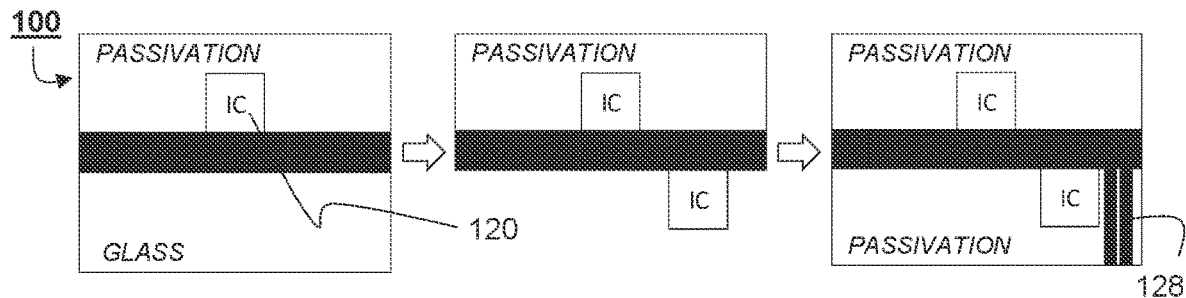
FIGS. 15(a)-(c) are simplified illustrations of another example embodiment of the present invention, in form of a double-sided flexible interposer with Si IC's on both sides, and embedded in a rigid or flexible encapsulation or board/package, in particular, showing the manufacturing steps (a) where the Si IC is attached to the upper side of the flexible interposer and embedded in passivation whilst on a glass carrier, (b) where the glass carrier is removed and a second Si IC is mounted to the bottom side of the flexible interposer, and (c) where the bottom mounted Si IC is embedded in passivation, with one or more vias suitable to connect at least one of the Si IC's to the wider system, one of more of the Si IC's may be an embedded sensor, for example, for use in wearables, where an external sensor (e.g. for skin contact) is built onto or into the flexible interposer.

FIG. 15 is a simplified illustration of another example embodiment of the present invention, in the form of a double-sided flexible interposer with Si IC's on both sides, and embedded in a rigid or flexible passivation, encapsulation or board/package. One or more of the Si IC's may be an embedded sensor. An example of an interposer assembly including embedded sensors may be used, for example, in wearable electronic devices, where an external sensor is built onto or into the flexible interposer, e.g. for skin contact. FIGS. 15(a) to 15(c) reflect the steps in manufacture. In particular, in FIG. 15(a) a Si IC 120 is attached to the upper side of a flexible interposer and embedded in passivation whilst the flexible interposer (also called FlexIC) is on a glass carrier. In FIG. 15(b) the flexible interposer 100 has been detached from the glass carrier and in (c) a second Si IC 120 has been mounted to the underside of the flexible interposer and is embedded in passivation. One or more vias 128 connect one or both Si IC's 120 to the wider system.

Figure 16:
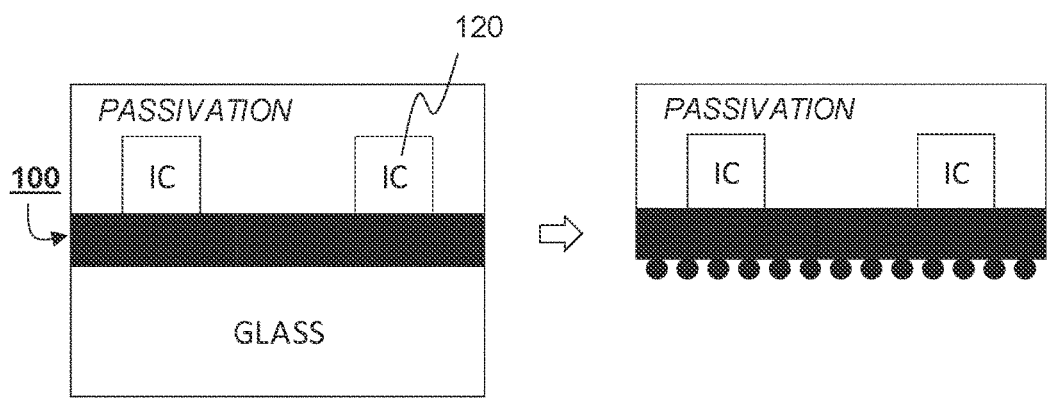
FIGS. 16(a) and 16(b) are simplified illustrations of another example embodiment of the present invention, with embedded Si IC's on a flexible interposer in a rigid or flexible package, where passivation (PASS) or package material aids heat dissipation (as well as providing predetermined mechanical properties), (a) on glass and (b) with bumps/balls.

FIG. 16 illustrates an example for embedding silicon IC's and/or sensors, where Si IC's 120 are embedded in a flexible interposer assembly (on the flexible interposer) in a rigid or flexible package. A passivation (PASS) layer or package material may be configured to aid heat dissipation. Here, short separation from the PCB (short interposer tracks) can minimise thermal issues. As illustrated in FIG. 16(a) the interposer 100 (i.e. FlexIC) is manufactured on a glass carrier, the silicon IC's 120 are attached to the interposer 100, and passivation is applied. The interposer 100, Si IC's 120 and passivation are then removed from the carrier and prepared for subsequent attachment to a package or application circuit, e.g. by attaching solder balls to the interposer (FIG. 16(b)).

Figure 20:
FIGS. 20(a)-(k) are illustrations of manufacturing steps (a) to (k) for embedding SI IC's and other components in accordance with the 'mount silicon first' process shown in FIG. 19.
Figure 20:
Figure 20:
Figure 20:
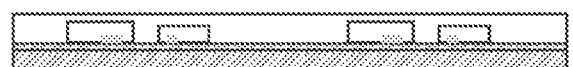
Figure 20:
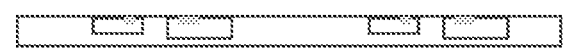
Figure 20:
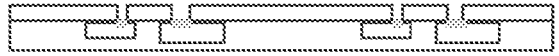
Figure 20:
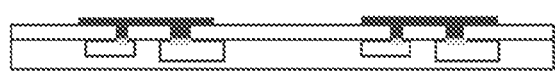
Figure 20:
Figure 20:
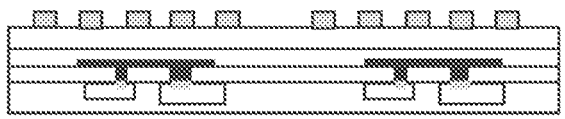
Figure 20:
Figure 20:
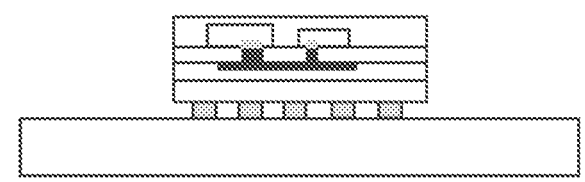

A related example for embedding silicon ICs and other components is illustrated in FIGS. 20 (a) to (k) and is an application of the interposers described herein to fan-out wafer level packaging (FOWLP). In this approach, SI IC's and any other components are temporarily bonded to a carrier (e.g. glass, silicon—see step (a)), with their electrical contacts facing towards the carrier (see steps (b) and (c)). A rigid or flexible package is formed around and on top of the IC's and components, in an over-moulding step (see step (d)). This produces a reconstituted wafer of SI IC's and any other components, which is then removed from the carrier and inverted. The reconstituted wafer is then typically self-supporting through the subsequent steps, however, it may be temporarily bonded to a carrier (with the electrical contacts of the SI IC's and components facing away from the carrier), if necessary. Similar steps to those used in the 'mount silicon first' approach (see FIGS. 19 (a) to (j)) are employed to manufacture an interposer on top of the reconstituted wafer, making contact with the exposed SI IC's and other components within. This method may be used to produce a system-in-package (SiP) with high density contact redistribution and with active and passive components integrated into the interposer. In comparison to the 'mount silicon first' approach, this method provides several advantages, such as, for example, that the contacts of the SI IC's and components are presented at a planarised surface, and that the SI IC's and components are fully encapsulated as a part of the process. The steps illustrated in FIG. 20 include (a) glass (or silicon) carrier, (b) adhesive coating, (c) place SI IC's and any components, contacts-side downwards, (d) encapsulate or overmould to form a 'reconstituted wafer', (e) remove reconstituted wafer from carrier, invert, optionally place on a carrier, (f) dielectric deposition and patterning, (g) metal deposition and patterning, (h) TFT stack processing (semiconductors, dielectrics, metal lines, etc. forming active and passive components and tracking), (i)

final passivation and RDL (metal contacts and vias) layers, (j) dice, (k) attach (solder/ACP/etc.) to system level PCB.

(iv) Example Interposer Functions

Examples of interposer functions may include:

An Application Specific Integrated Circuit (ASIC) interposer may eliminate glue-logic (incorporating active components and/or passive components), fan-in/fan-out (multiplexing and serial/parallelization), level shifters, etc. from one or more silicon ASICs in a system.

Electrostatic Discharge (ESD) protection and I/O buffers may be provided in the interposer of the present invention, consequently, reducing Si area required. Such ESD protection may be provided by a diode structure (Schottky diode) as described in WO2019/116020A1 (incorporated herein by reference).

Power circuitry for low power states, i.e. low off-current, on a die by die basis with TFTs, e.g. IGZO TFTs, in the interposer.

Memory circuits in the flexible interposer, e.g. using a laser fuse-based PROM or non-volatile memory elements.

TFT circuits, e.g. for RFID, energy harvesting, integrated into the flexible interposer.

Programmable connections between system components, built into (and optionally accessible from) the interposer.

(v) Example Systems

Examples of systems comprising the flexible interposer of the present invention may include a flexible 2.5D System in Package (SiP) interposer with integrated active and/or passive components, configured to reduce overall SiP bill of materials (BoM). An example system may be a Flex 2.5D SiP interposer connecting a processor with ADC and sensor(s), or a Flex 2.5D SiP with multiplexers/demultiplexers built into the interposer's TFT circuits (active layer).

Other systems may comprise an antenna, e.g. for a 5G chipset that is included in the package on a flexible interposer, providing reduced cost and area.

The interposer of the present invention may also provide for an improved/simplified print-head system design. Currently a complex system of MEMs and ASICs on flexible PCBs of different resolutions are employed for this application.

Figure 17:
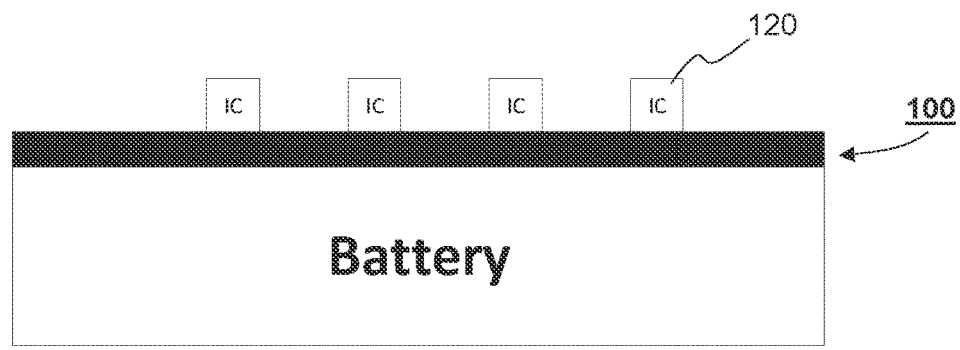
FIG. 17 is a simplified illustration of another example embodiment of the present invention, where a fully integrated electronic assembly comprises a flexible interposer and other system components, as well as, a battery that may also be flexible.

FIG. 17 illustrates an example of a fully integrated electronic assembly comprising a flexible interposer 100, Si IC(s) 120, a battery (which may be flexible) and other system components.

Example embodiments of wearable electronics systems may include (i) systems with one or more embedded external sensor(s) (e.g. for skin contact) connected onto or into the flexible interposer 100, (ii) smart 'suits', e.g. for doctors/surgeons, coupled with Virtual (VR) or Augmented Reality (AR), (iii) watches, fitness monitors etc. enabling flexibility and thinner form factors, (iv) systems for health monitoring, e.g. continuous glucose monitors or pumps, heart rate monitors, blood pressure monitors, wound management or body area networks.

Other example embodiments of the present invention may include:

medical implants, e.g. subcutaneous (e.g. to detect bio-electrical signals such as ECG or biochemical concentrations such as glucose) or cochlear implants.

Medicine packaging, e.g. with displays/speech, for improved compliance.

Using the interposer assembly for connecting a large number of sensors, distributed over a large area, to a master processor, e.g. in autonomous vehicles, or for connecting multiple separate high-performance computing cores with high density, high bandwidth wiring whilst performing some of the functions outlined above.

Embedded active electronics within a battery cell/pack, e.g. for charge/discharge management and protection, indicators, etc.

Display driver attach and fan-out with active and/or passive components that are built-in allowing "flexible" and easier placement, e.g. may be used in automotive interior displays that are built into curved dashboards, pillars, overhead lighting, etc. Embodiments may also be used more generally as an active, transparent display backplane, including micro LED displays.

Vibration monitors, where the flexible interposer assembly could improve the system sensitivity, as it is less rigid.

MEMS interposer, where movement and/or flexibility is required.

As can be understood from the information disclosed, the present invention provides a series of advantages, such as, (i) reduced manufacturing costs, for example by employing low temperature thin-film, polymer-based technology; such cost reductions may enable current IC-containing products, even low-cost micro-controllers, to be offered at a significantly lower price point, by using bare, instead of packaged, die, (ii) flexibility, (iii) improved thermal insulation properties, (iv) a large area, as the interposer assembly could be used in applications where the final product is relatively large, e.g. the full (e.g. 8" diameter) wafer or panel size may be used as the interposer, (v) substantial optical transparency, (vi) rapid turn-around design, for example by employing low temperature manufacturing processes, and (vii) very thin form factors compared to existing flexible interposers, e.g. FR4 (at hundreds of μm) limits the thinness of current systems, wherein the flexible interposer assembly may allow an order of magnitude thinner than the current limits.

It is understood by the person skilled in the art that other packaging (or 'advanced integration') technologies employing a fan-out element may also be improved by using an interposer assembly of the present invention, i.e. with integrated active and passive components. One example may be a wafer-level fan-out packaging (WLFO or FOWLP) in which silicon wafers are diced and 'reconstituted' before being attached to a redistribution layer (RDL). There are variants of this approach to packaging, e.g. chip-first/RDL-last fan-out and RDL-first/chip-last fan-out, however the interposers described in this disclosure may in any case enhance the functionality of the RDL whilst potentially simplifying the design of the silicon chip, by performing some of that chip's functionality in the interposer.

It will be appreciated by persons skilled in the art that the above embodiment(s) have been described by way of example only and not in any limitative sense, and that various alterations and modifications are possible without departing from the scope of the invention as defined by the appended claims.

The invention claimed is:

1. An interposer subassembly configured for an electronic system having at least one integrated circuit (IC) component, the interposer subassembly comprising:

a flexible base layer, having a first surface and an opposing second surface;

at least one active electronic circuit component comprising a thin film of semiconductor material, operatively integrated and embedded directly within said flexible base layer;
at least one first patterned contact layer, provided on any one of said first surface and said second surface of said flexible base layer, and configured to operably interface with said at least one active electronic circuit component and the at least one IC component,
wherein the at least one IC component is external to the interposer subassembly,
wherein the interposer subassembly further comprises at least one thermal management layer embedded in said flexible base layer,
wherein the at least one thermal management layer is configured to transfer heat energy away from said at least one active electronic circuit component, and
wherein a layer of the interposer subassembly at the first surface has a different coefficient of thermal expansion than a layer of the interposer at the second surface.

2. The interposer subassembly according to claim 1, further comprising at least one second patterned contact layer, provided on said flexible base layer at a surface opposite to said first patterned contact layer, and configured to operably connect to any one or any combination of said at least one active electronic circuit component, said first patterned contact layer, and the at least one IC.

3. The interposer subassembly according to claim 2, wherein said at least one first patterned contact layer comprises a plurality of first contact elements having a first line pitch, and, said at least one second patterned contact layer comprises a plurality of second contact elements having a second line pitch.

4. The interposer subassembly according to claim 3, wherein said first line pitch is different to said second line pitch.

5. The interposer subassembly according to claim 2, further comprising at least one passive electronic circuit component, operatively integrated within said flexible base layer and operably connected to said at least one active electronic circuit component and/or said at least one first patterned contact layer and/or said at least one second patterned contact layer.

6. The interposer subassembly according to claim 5, further comprising at least one conductive via, extending through at least a portion of said flexible base layer between said first surface and said opposing second surface, configured to operably connect any one or any combination of said at least one active electronic circuit component, said at least one passive electronic circuit component, said at least one first patterned contact layer and said at least one second patterned contact layer.

7. The interposer subassembly according to claim 1, wherein said flexible base layer comprises at least one dielectric layer material integrated within at least a portion of said flexible base layer and/or on at least a portion of said first surface of said flexible base layer and/or on at least a portion of said opposing second surface of said flexible base layer.

8. The interposer subassembly according to claim 1, wherein at least a portion of said at least one thermal management layer is electrically insulating.

9. The interposer subassembly according to claim 1, wherein said at least one thermal management layer has a predetermined coefficient of thermal expansion (CTE).

10. The interposer subassembly according to claim 1, wherein said semiconductor material has a predetermined dopant concentration.

11. The interposer subassembly according to claim 10, wherein said predetermined dopant concentration is a predetermined concentration profile gradation of dopants.

12. The interposer subassembly according to claim 1, wherein said at least one active electronic circuit component is a transistor.

13. The interposer subassembly according to claim 5, wherein said at least one passive electronic circuit component comprises a metal integrated into said flexible base layer.

14. The interposer subassembly according to claim 1, wherein said at least one first patterned contact layer is made of an electrically conductive material.

15. The interposer subassembly according to claim 14, wherein said electrically conductive material comprises at least one metal.

16. The electronic system comprising:
the interposer subassembly according to claim 1; and
at least one first electronic component mounted to and electrically connected to said interposer subassembly.

17. The electronic system according to claim 16, wherein said at least one first electronic component is at least partially encased within an encapsulant material.

18. The electronic system according to claim 16, wherein said encapsulant material comprises a polymer.

19. The electronic system according to claim 16, wherein said at least one first electronic component is electrically connected to said interposer subassembly by at least one wire bond.

20. The electronic systems according to claim 16, wherein said at least one first electronic component is electrically connected to said interposer subassembly in a flip-chip configuration.

21. The interposer subassembly according to claim 5, wherein said at least one passive electronic circuit component is any one of a resistor, capacitor, inductor and diode.

22. The interposer subassembly according to claim 1, wherein said flexible base layer is formed from any one or any combination of substrate, glass, polymer, cellulose and metal.

* * * * *